US011515289B2

(12) United States Patent
Chava et al.

(10) Patent No.: US 11,515,289 B2
(45) Date of Patent: Nov. 29, 2022

(54) STACKED DIE INTEGRATED WITH PACKAGE VOLTAGE REGULATORS

(71) Applicant: QUALCOMM Incorporated, San Diego, CA (US)

(72) Inventors: Bharani Chava, Cork City (IE); Stanley Seungchul Song, San Diego, CA (US); Abinash Roy, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 132 days.

(21) Appl. No.: 17/015,308

(22) Filed: Sep. 9, 2020

(65) Prior Publication Data

US 2022/0077109 A1    Mar. 10, 2022

(51) Int. Cl.
*H01L 25/065* (2006.01)
*H01L 21/78* (2006.01)
*H01L 23/00* (2006.01)
*H01L 25/00* (2006.01)

(52) U.S. Cl.
CPC ......... *H01L 25/0652* (2013.01); *H01L 21/78* (2013.01); *H01L 24/08* (2013.01); *H01L 24/80* (2013.01); *H01L 25/50* (2013.01); *H01L 2224/08145* (2013.01); *H01L 2224/80006* (2013.01); *H01L 2224/80895* (2013.01); *H01L 2224/80896* (2013.01); *H01L 2225/06517* (2013.01); *H01L 2225/06572* (2013.01); *H01L 2924/1205* (2013.01); *H01L 2924/1206* (2013.01); *H01L 2924/1427* (2013.01); *H01L 2924/1434* (2013.01); *H01L 2924/19105* (2013.01)

(58) Field of Classification Search
CPC ....... H01L 25/0657; H01L 2224/08145; H01L 2924/1427; H01L 25/0652; H01L 24/08; H01L 24/80; H01L 25/50; H01L 2224/80895; H01L 2225/06517; H01L 2225/06572; H01L 2924/1205; H01L 2924/1206; H01L 2924/1434; H01L 2924/19105; H01L 2224/16227
See application file for complete search history.

(56) References Cited

U.S. PATENT DOCUMENTS

| 8,982,563 | B2 | 3/2015 | Raj et al. |
| 9,406,648 | B2 | 8/2016 | Wang et al. |
| 10,600,691 | B2 | 3/2020 | DeLacruz et al. |
| 2012/0112352 | A1 | 5/2012 | Chi et al. |
| 2019/0333876 | A1 | 10/2019 | Yudanov |
| 2020/0020635 | A1 | 1/2020 | Chang et al. |

(Continued)

OTHER PUBLICATIONS

International Search Report and Written Opinion—PCT/US2021/039621—ISA/EPO—dated Oct. 25, 2021.

*Primary Examiner* — Thanh Y. Tran
(74) *Attorney, Agent, or Firm* — Qualcomm Incorporated

(57) ABSTRACT

An integrated circuit (IC) package is described. The IC package includes a first die having a first power delivery network on the first die. The IC package also includes a second die having a second power delivery network on the second die. The first die is stacked on the second die. The IC package further includes package voltage regulators integrated with and coupled to the first die and/or the second die within a package core of the integrated circuit package.

20 Claims, 13 Drawing Sheets

(56) References Cited

U.S. PATENT DOCUMENTS

2020/0075553 A1 3/2020 Delacruz et al.
2021/0028145 A1* 1/2021 Yu ...................... H01L 21/4853
2021/0066254 A1* 3/2021 Yu ...................... H01L 23/5389

* cited by examiner

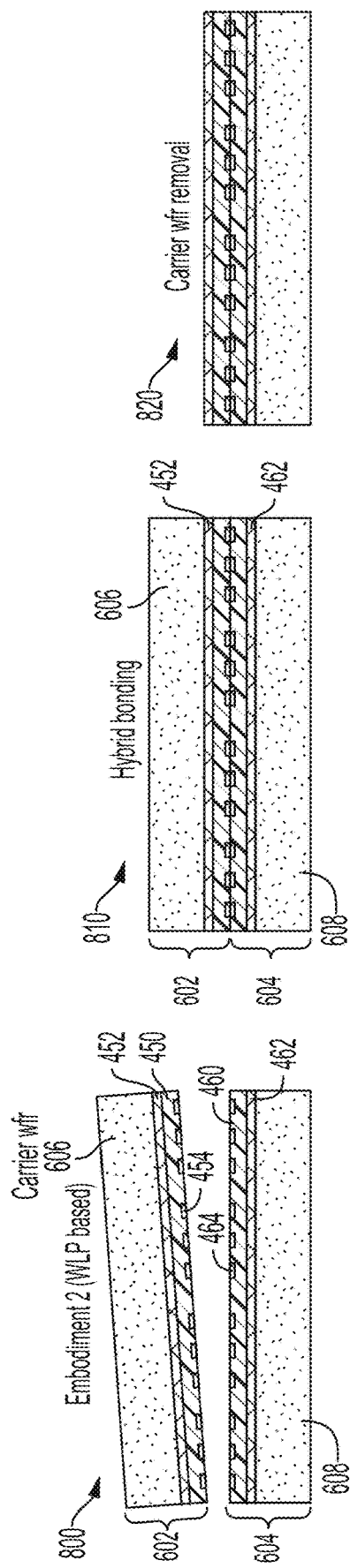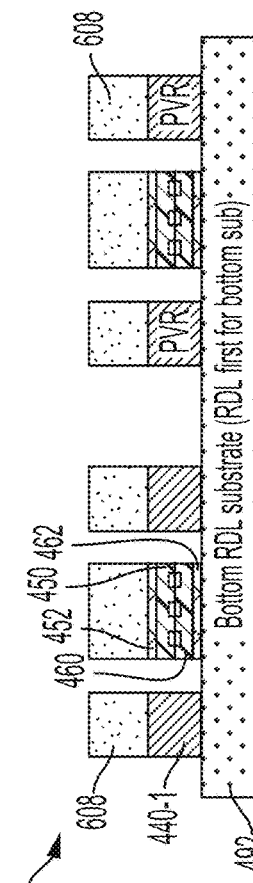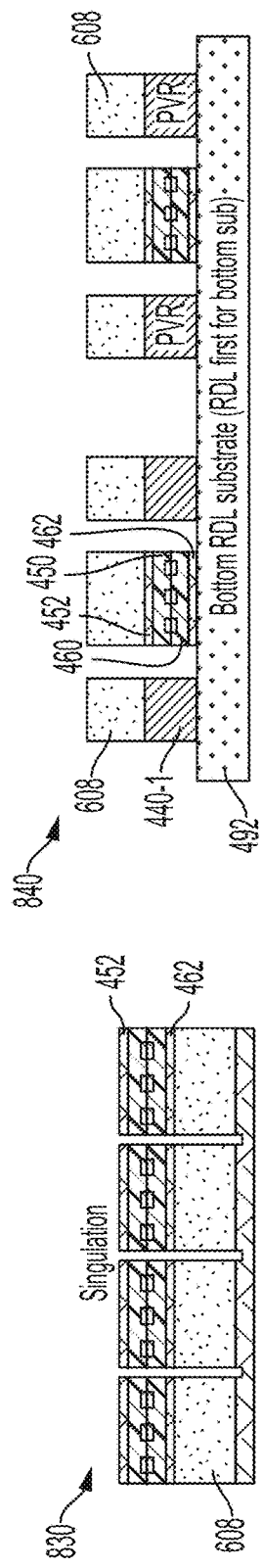

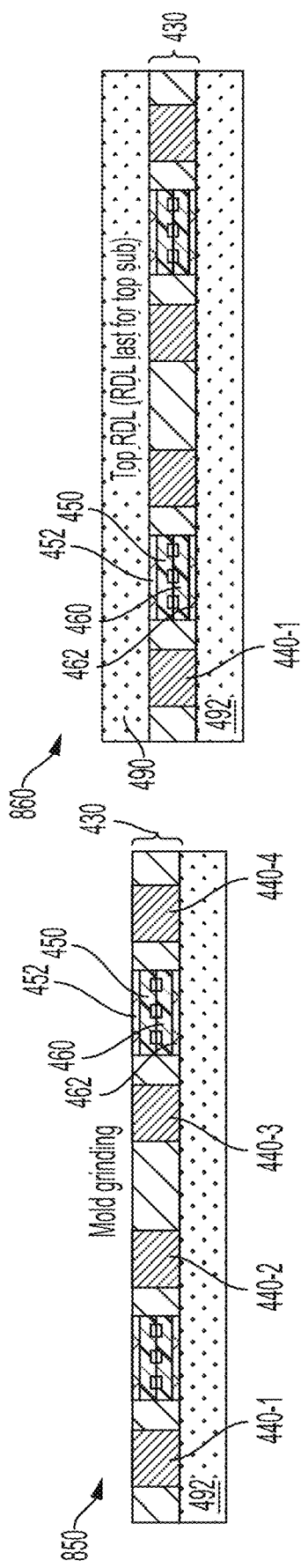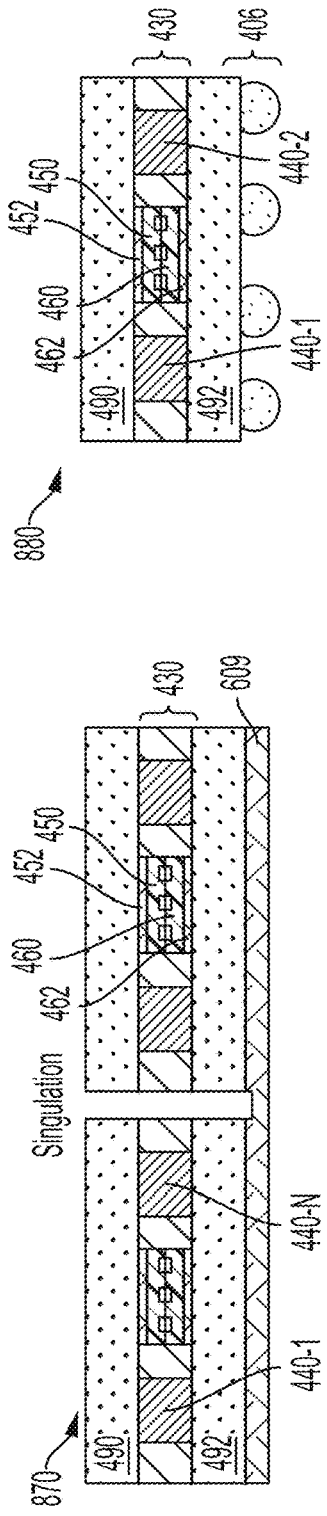

STACKED DIE INTEGRATED WITH PACKAGE VOLTAGE REGULATORS

BACKGROUND

Field

Aspects of the present disclosure relate to integrated circuits and, more particularly, to a stacked die integrated with package voltage regulators (PVRs).

Background

Electrical connections exist at each level of a system hierarchy. This system hierarchy includes interconnection of active devices at a lowest system level all the way up to system level interconnections at the highest level. For example, interconnect layers can connect different devices together on an integrated circuit. As integrated circuits become more complex, more interconnect layers are used to provide the electrical connections between the devices. More recently, the number of interconnect levels for circuitry has substantially increased due to the large number of devices that are now interconnected in a modern electronic device. The increased number of interconnect levels for supporting the increased number of devices involves more intricate processes.

State-of-the-art mobile application devices demand a small form factor, low cost, a tight power budget, and high electrical performance. Mobile package design has evolved to meet these divergent goals for enabling mobile applications that support multimedia enhancements. These mobile applications, however, are susceptible to power and signal routing issues when multiple dies are arranged within the small form factor.

SUMMARY

An integrated circuit (IC) package is described. The IC package includes a first die having a first power delivery network on the first die. The IC package also includes a second die having a second power delivery network on the second die. The first die is stacked on the second die. The IC package further includes package voltage regulators integrated with and coupled to the first die and/or the second die within a package core of the integrated circuit package.

A method for fabricating an integrated circuit package having a stacked die integrated with package voltage regulators is described. The method includes fabricating a first die wafer having a first power delivery network on the first die on a first wafer. The method also includes fabricating a second die having a second power delivery network on the on the second die on a second wafer. The method further includes bonding the first wafer to the second wafer to form a stacked die wafer. The method also includes singulating the stacked die wafer to form the stacked die including the first power delivery network and the second power delivery network. The method further includes placing the stacked die on a second package substrate integrated with the package voltage regulators within a package core of the integrated circuit package.

An integrated circuit (IC) package is described. The IC package includes a first die having a first power delivery network on the first die. The IC package also includes a second die having a second power delivery network on the second die. The first die is stacked on the second die. The IC package further includes means for regulating voltage integrated with and coupled to the first die and/or the second die within a package core of the integrated circuit package.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 8A-8I are cross-sectional diagrams illustrating a process of fabricating the integrated circuit (IC) package of FIG. 7, having the stacked die integrated with package voltage regulators, according to another aspect of the present disclosure.

DETAILED DESCRIPTION

Figure 1:
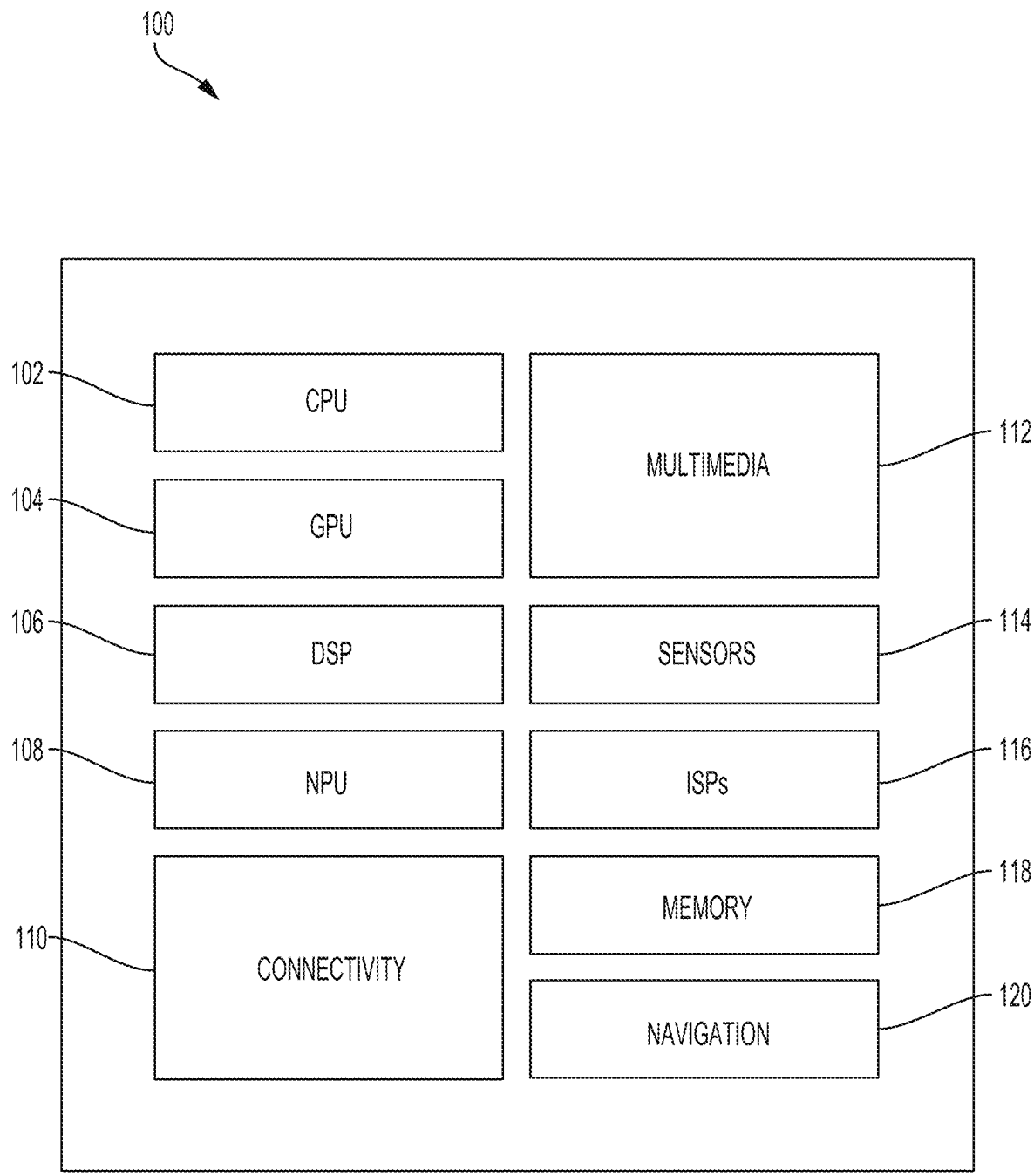
FIG. 1 illustrates an example implementation of a host system-on-a-chip (SOC), including a 3D integrated circuit (IC) device having a stacked die integrated with package voltage regulators (PVRs), in accordance with certain aspects of the present disclosure.

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described, the use of the term "and/or" is intended to represent an "inclusive OR," and the use of the term "or" is intended to represent an "exclusive OR." As described, the term "exemplary" used throughout this description means "serving as an example, instance, or illustration," and should not necessarily be construed as preferred or advantageous over other exemplary configurations. As described, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described, the term "proximate" used throughout this description means "adjacent, very near, next to, or close to." As described, the term "on" used throughout this description means "directly on" in some configurations, and "indirectly on" in other configurations.

A system hierarchy includes interconnection of active devices at a lowest system level all the way up to system level interconnections at a highest level. In particular, electrical connections exist at each of the levels of the system hierarchy to connect different devices together on an integrated circuit (IC). As integrated circuits become more complex, however, more interconnect layers are used to provide the electrical connections between the devices. More recently, the number of interconnect levels for circuitry has substantially increased due to the large number of devices that are now interconnected in a state-of-the-art mobile application device.

These interconnections include back-end-of-line (BEOL) interconnect layers, which may refer to the conductive interconnect layers for electrically coupling to front-end-of-line (FEOL) active devices of an integrated circuit (IC). The various BEOL interconnect layers are formed at corresponding BEOL interconnect levels, in which lower BEOL interconnect levels use thinner metal layers relative to upper BEOL interconnect levels. The BEOL interconnect layers may electrically couple to middle-of-line (MOL) interconnect layers, which interconnect to the FEOL active devices of an IC.

State-of-the-art mobile application devices demand a small form factor, low cost, a tight power budget, and high electrical performance. Mobile package design has evolved to meet these divergent goals for enabling mobile applications that support multimedia enhancements. For example, fan-out (FO) wafer level packaging (WLP) or FO-WLP process technology is a new development in packaging technology that is useful for mobile applications. This chip first FO-WLP process technology solution provides flexibility to fan-in and fan-out connections from a die to package balls. In addition, this solution also provides a height reduction of a first level interconnect between the die and the package balls of mobile application devices. These mobile applications, however, are susceptible to power and signal routing issues when multiple dies are arranged within the small form factor.

Stacked die schemes and chiplet architectures are becoming mainstream as significant power performance area (PPA) yield enhancements are demonstrated for stacked die and chiplet architecture product lines. Unfortunately, successful stacked die schemes involve high power density targets, which impose significant power delivery losses. Furthermore, a difference in a coefficient of expansion between a die, a substrate, and a printed circuit board (PCB) results in stress on the solder joints attaching a ball grid array (BGA) package to the PCB. The problem is exacerbated by shrinking of ball pitch, increasing of die size, and/or thinning of substrates to accommodate the small form factor.

Various aspects of the present disclosure provide an integrated circuit (IC) package having a stacked die integrated with package voltage regulators (PVRs). The process flow for fabrication of the stacked die integrated with the package voltage regulators may include a wafer level packaging (WLP) process technology. It will be understood that the term "layer" includes film, and is not construed as indicating a vertical or horizontal thickness unless otherwise stated. As described, the term "substrate" may refer to a substrate of a diced wafer or may refer to a substrate of a wafer that is not diced. As further described, the term "laminate" may refer to a multilayer sheet to enable packaging of an IC device. As described, the term "chiplet" may refer to an integrated circuit block, a functional circuit block, or other like circuit block specifically designed to work with other similar chiplets to form a larger, more complex chiplet architecture. The terms "substrate," "wafer," and "laminate" may be used interchangeably. Similarly, the terms "chip," "chiplet," and "die" may be used interchangeably.

Package voltage regulation is a scheme that improves overall system power performance area, while reducing lossy transmission of power for all product lines. In particular, package voltage regulators minimize printed circuit board (PCB) and package power losses by down conversion at load circuits or the die inside the package. Package voltage regulation enables continued use of ball grid array packages, which are used for wire bond or flip chip configurations for supporting multiple die (e.g., stacks of die). A specific benefit of the present disclosure is improved reliability, which is important in handheld devices specified to pass drop tests. Cell phone makers continue to increase the specifications of the drop tests, and an ability to exceed (not just meet the standard) provides a competitive advantage. In addition, a significant performance increase, as well as an improved minimum target voltage (Vcc_min) at the die, is provided, according to aspects of the present disclosure.

Aspects of the present disclosure are directed to an integrated circuit (IC) package including stacked die integrated with package voltage regulators (PVRs). In one configuration, the IC package includes a first die having a front-side surface and a backside surface, opposite the front-side surface. In this configuration, the backside surface is on a front-side surface of a first power delivery network.

The IC package further includes a second die having a front-side surface on the front-side surface of the first die to form a stacked die, which may be in a face-to-face (F2F) bonding configuration. In this configuration, a backside surface of the second die is on a front-side surface of a second power delivery network, which is distal from the first power delivery network. In an alternative configuration, the face-to-face bonding is between backside surfaces of the first die and the second die, such that the package voltage regulators supply power to the front-sides of the stacked die.

According to aspects of the present disclosure, the integrated circuit (IC) package includes package voltage regulators integrated with the first die and the second die in a package core of the IC package. In this configuration, the package voltage regulators are configured to independently power the first die and the second die or different subsystems on the die. In one configuration, the IC package includes a first package substrate coupled to a backside surface of the first power delivery network through first contact bumps. In addition, a second package substrate is coupled to a backside surface of the second power delivery network through second contact bumps. In this configuration, the second package substrate is distal from the first package substrate, such that the package voltage regulators are coupled between the first package substrate and the second package substrate. In addition, the first package substrate is coupled to the first die through the first contact bumps, and the second package substrate is coupled to the second die through the second contact bumps.

FIG. 1 illustrates an example implementation of a host system-on-a-chip (SOC) 100, which includes stacked die integrated with package voltage regulators (PVRs), in accordance with aspects of the present disclosure. The host SOC 100 includes processing blocks tailored to specific functions, such as a connectivity block 110. The connectivity block 110 may include fifth generation (5G) connectivity, fourth generation long term evolution (4G LTE) connectivity, Wi-Fi connectivity, USB connectivity, Bluetooth® connectivity, Secure Digital (SD) connectivity, and the like.

In this configuration, the host SOC 100 includes various processing units that support multi-threaded operation. For the configuration shown in FIG. 1, the host SOC 100 includes a multi-core central processing unit (CPU) 102, a graphics processor unit (GPU) 104, a digital signal processor (DSP) 106, and a neural processor unit (NPU) 108. The host SOC 100 may also include a sensor processor 114, image signal processors (ISPs) 116, a navigation module 120, which may include a global positioning system (GPS), and a memory 118. The multi-core CPU 102, the GPU 104, the DSP 106, the NPU 108, and the multi-media engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

Figure 2:
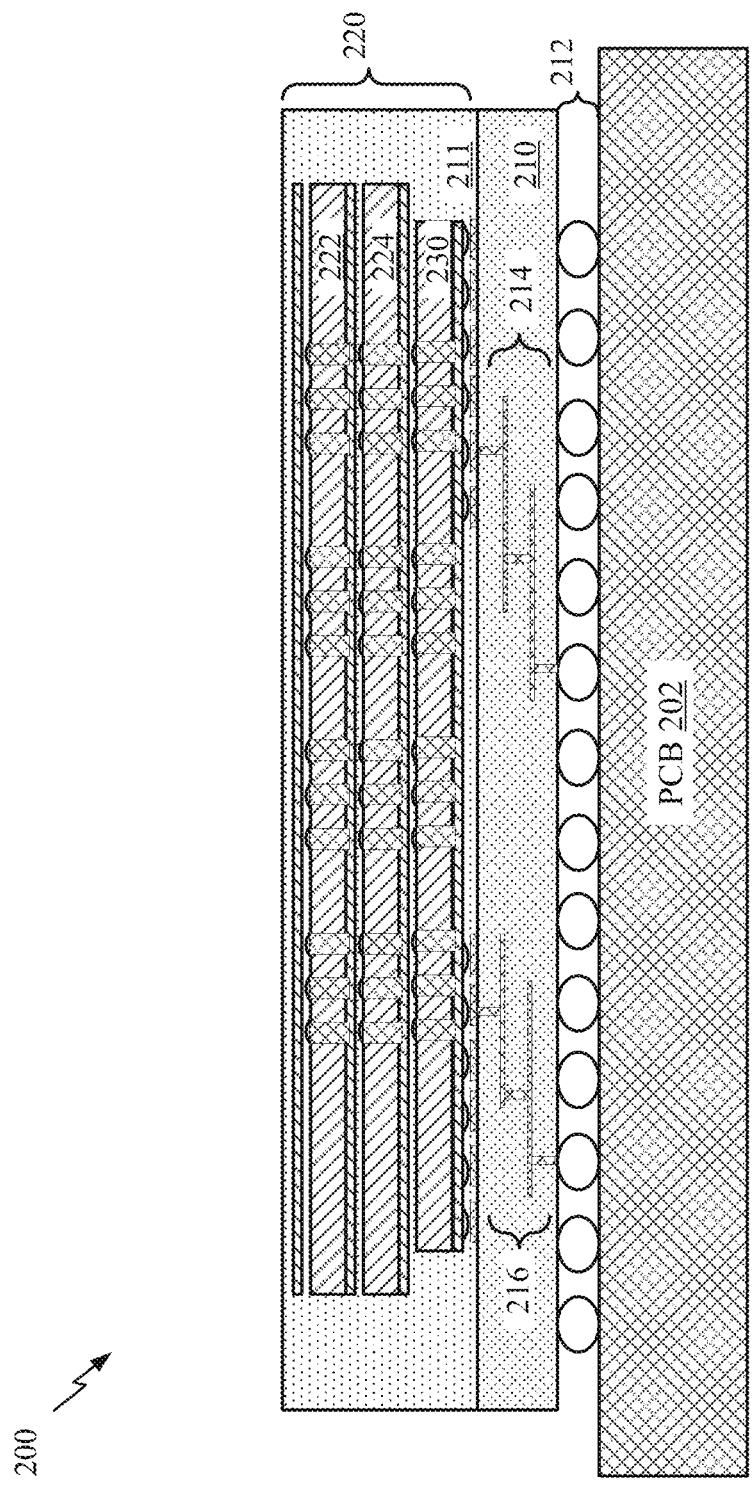
FIG. 2 shows a cross-sectional view of a stacked integrated circuit (IC) package, including the host system-on-a-chip (SOC) of FIG. 1.

FIG. 2 shows a cross-sectional view illustrating a stacked integrated circuit (IC) package 200 of the host system-on-a-chip (SOC) 100 of FIG. 1. Representatively, the stacked IC package 200 includes a printed circuit board (PCB) 202 connected to a package substrate 210 with interconnects 212. In this configuration, the package substrate 210 includes conductive layers 214 and 216. Above the package substrate 210 is a 3D chip stack 220, including stacked dies 222, 224, and 230, encapsulated by mold compound 211. In one aspect of the present disclosure, the die 230 is the host SOC 100 of FIG. 1.

Figure 3:
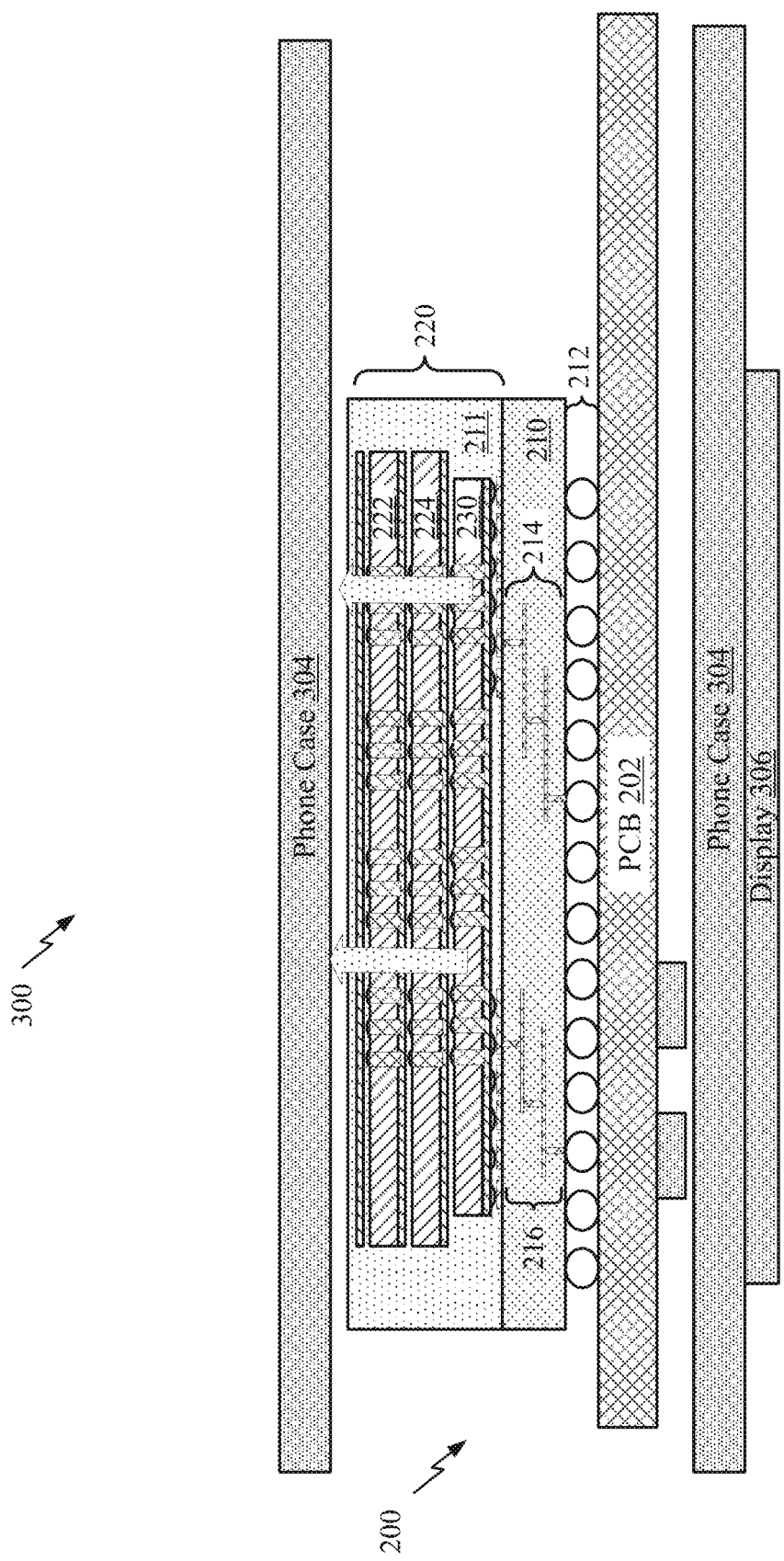
FIG. 3 shows a cross-sectional view illustrating the stacked integrated circuit (IC) package of FIG. 2, incorporated into a mobile device, according to one aspect of the present disclosure.
Figure 7:
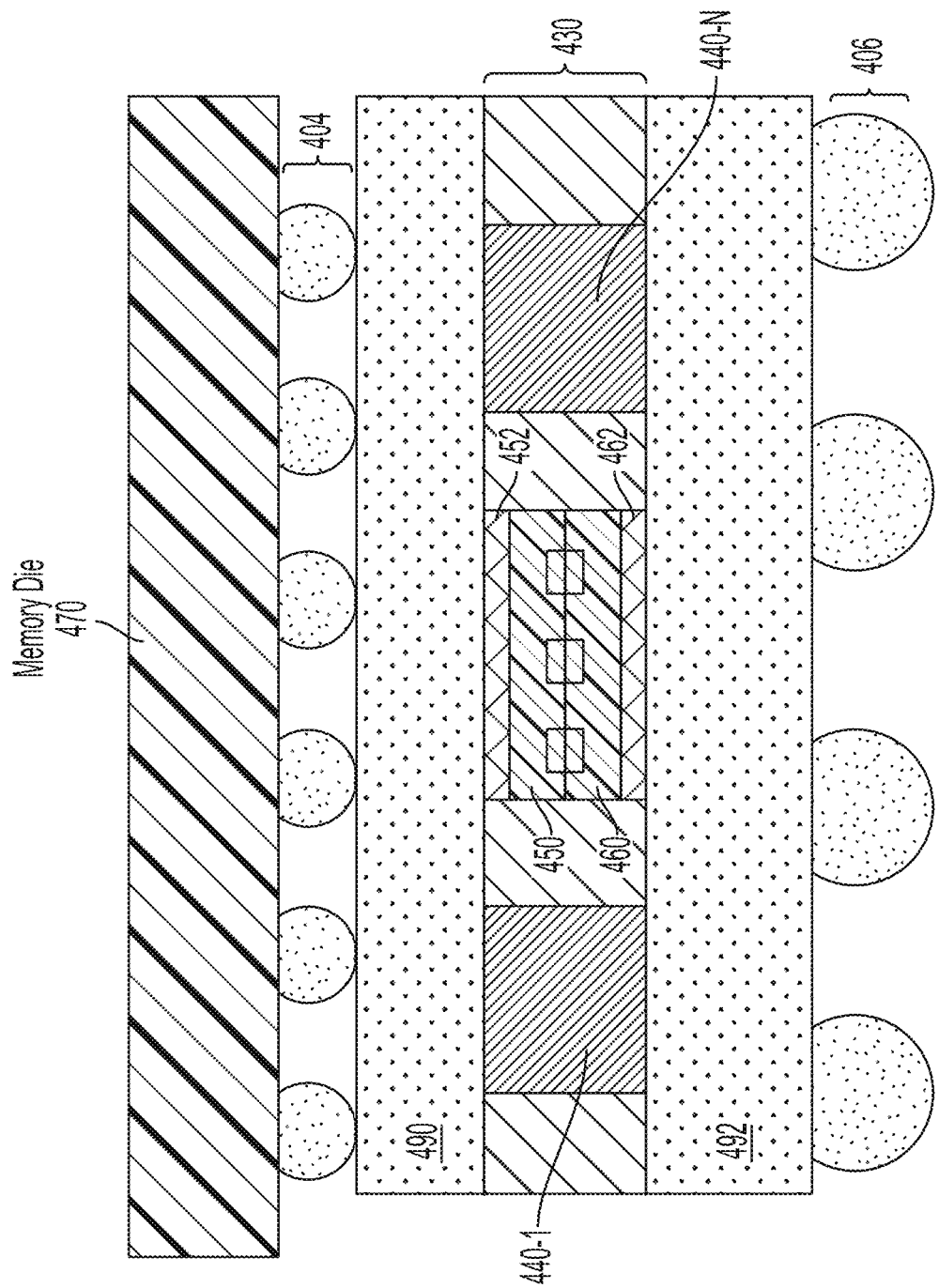
FIG. 7 is a cross-sectional diagram of the integrated circuit (IC) package of FIG. 4, having the stacked die integrated with package voltage regulators, according to another aspect of the present disclosure.

FIG. 3 shows a cross-sectional view illustrating the stacked integrated circuit (IC) package 200 of FIG. 2, incorporated into a wireless device 300, according to one aspect of the present disclosure. As described, the wireless device 300 may include, but is not limited to, a smartphone, tablet, handheld device, or other limited form factor device configured for 5G communications. Representatively, the stacked IC package 200 is within a phone case 304, including a display 306. In this configuration, an IC package having the stacked die integrated with package voltage regulators is integrated into the stacked IC package 200, for example, as shown in FIGS. 4 and 7.

Figure 4:
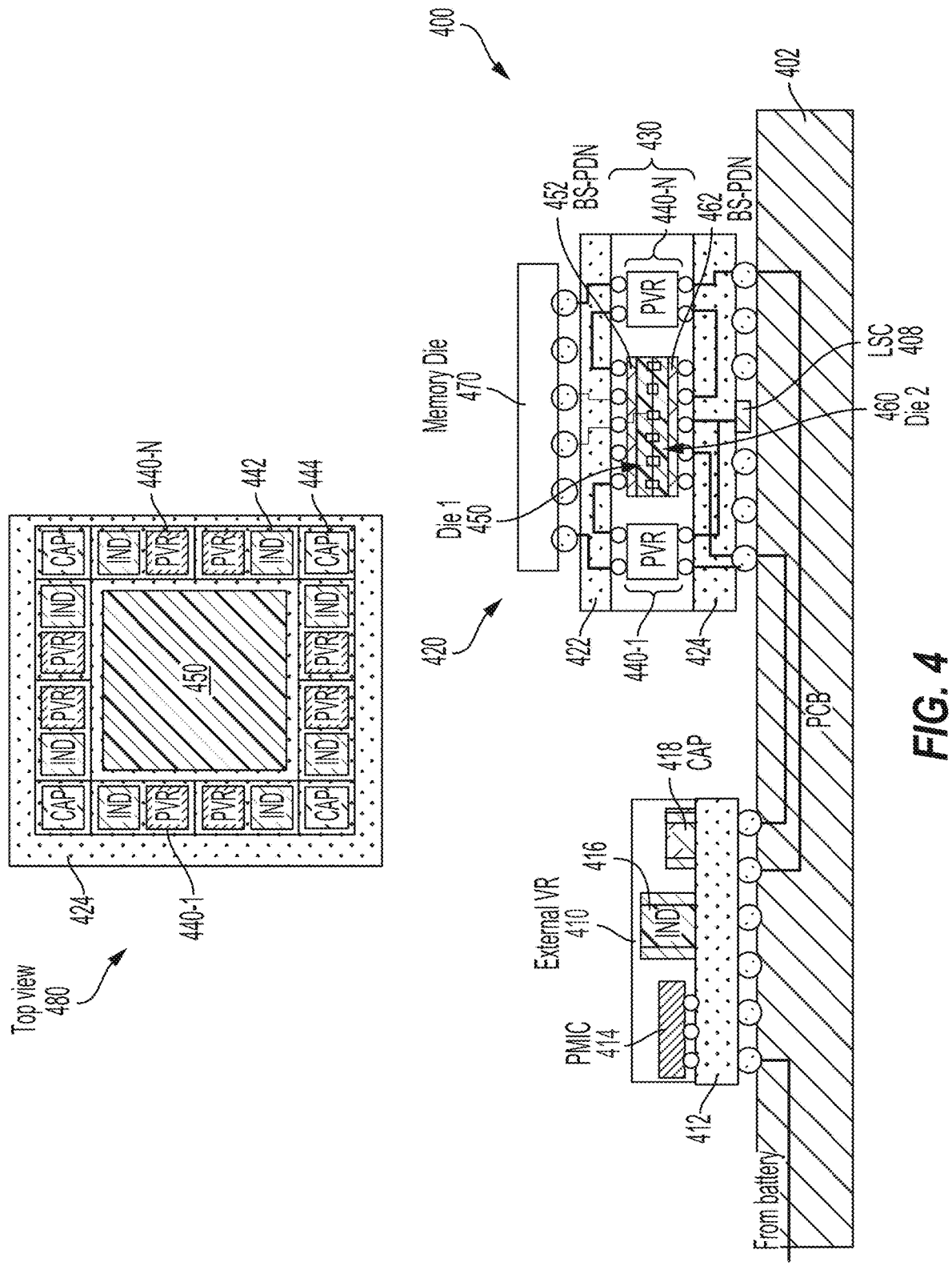
FIG. 4 is a block diagram illustrating cross-sectional and top views of a power delivery architecture, including an integrated circuit (IC) package having a stacked die integrated with package voltage regulators, according to aspects of the present disclosure.

FIG. 4 is a block diagram illustrating cross-sectional and top views of a power delivery architecture, including an integrated circuit (IC) package having a stacked die integrated with package voltage regulators, according to aspects of the present disclosure. As shown in FIG. 4, a power delivery architecture 400 includes an integrated circuit (IC) package 420 having a first die 450 and a second die 460 (e.g., a stacked die) integrated with package voltage regulators 440 (440-1 . . . 440-N) in a package core 430, according to aspects of the present disclosure. In one configuration, In particular, the package voltage regulators 440 reduce printed circuit board (PCB) and package power losses by down conversion at load circuits or the die inside the package. The power delivery architecture 400 includes a printed circuit board (PCB) 402 supporting an external voltage regulator 410 and the IC package 420, which supports a memory die 470.

In one configuration, the package voltage regulators 440 reduce power loss from the printed circuit board 402 as well as package power loss within the IC package 420 by down conversion at the die 450 and the second die 460 within the package core 430 of the IC package 420. In this configuration, the external voltage regulator 410 includes a power management integrated circuit (PMIC) 414 coupled to passive devices (e.g., an inductor 416 and a capacitor 418) supported by a substrate 412. In this example, the external voltage regulator 410 is powered by a battery (not shown).

In one aspect of the present disclosure, the IC package 420 is powered by the external voltage regulator 410 through the printed circuit board (PCB) 402 to the package voltage regulators 440 (440-1 . . . 440-N) in the package core 430. Integrating the package voltage regulators 440 (440-1 . . . 440-N) into the package core 430 improves overall system power performance area by replacing through mold interconnects (e.g., conductive core balls) within the package core 430. In particular, as shown in a top view 480, the package voltage regulators 440 (440-1 . . . 440-N) are placed surrounding a perimeter of the first die 450 including passive devices (e.g., inductors (IND) 442 and capacitors (CAP) 444) between a second package substrate 424 and a first package substrate 422 (not shown in the top view 480).

According to aspects of the present disclosure, the package voltage regulators 440 (440-1 . . . 440-N) enable continued use of ball grid array packages, which are used for wire bond or flip chip configuration for supporting multiple die (e.g., the first die 450 and the second die 460). In addition, a significant performance increase, as well as an improved minimum target voltage (Vcc_min) at the die (e.g., the first die 450 and the second die 460), is provided by the combination of the external voltage regulator 410 and the package voltage regulators 440 (440-1 . . . 440-N), according to aspects of the present disclosure. In this configuration, the integrated circuit (IC) package 420 includes a landside capacitor (LSC) 408. The first die 450 includes a first backside power delivery network 452 (BS-PDN), and the second die 460 includes a second backside power delivery network 462 (BS-PDN), as further illustrated in FIG. 5.

Figure 5:
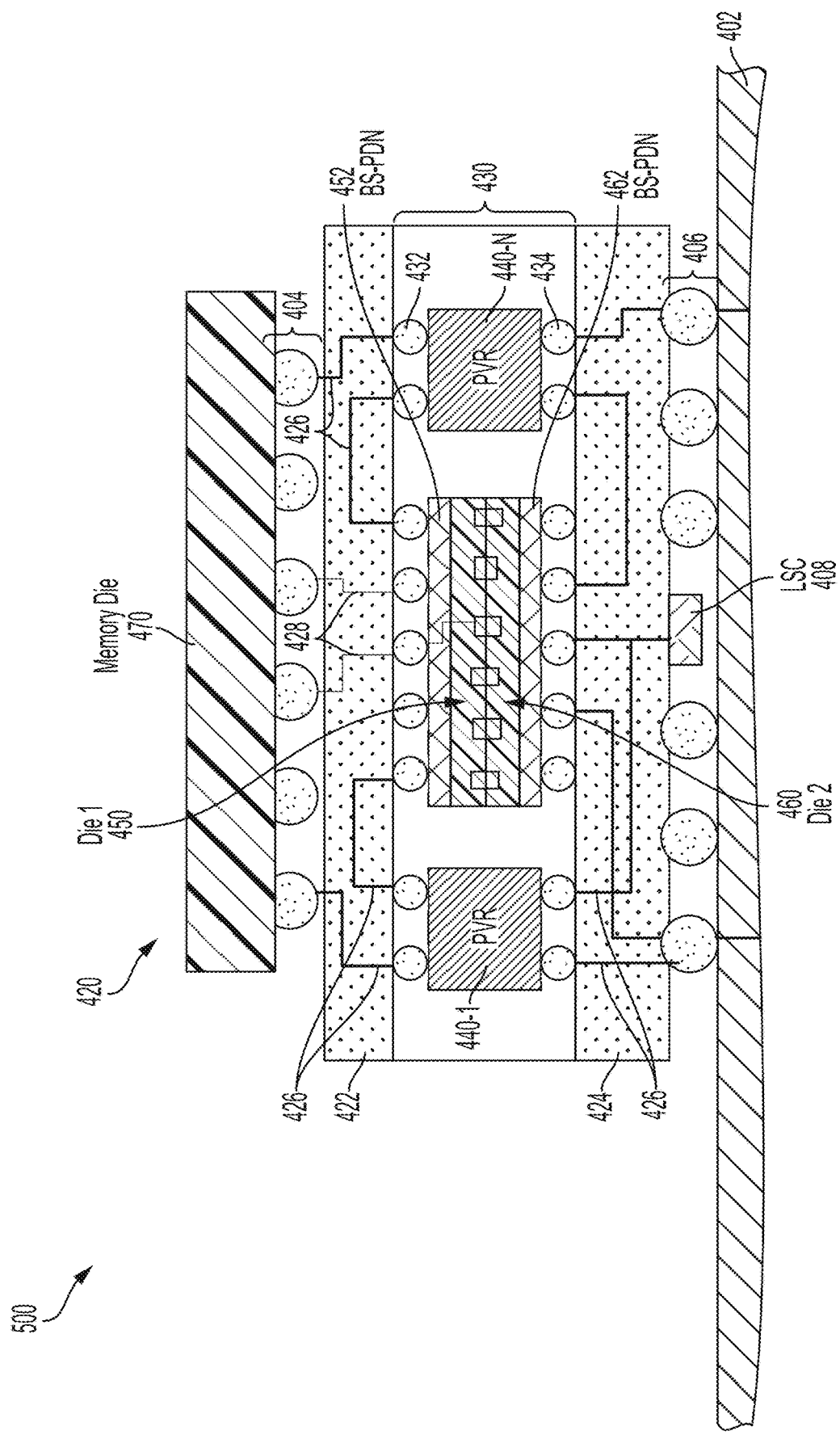
FIG. 5 is a cross-sectional diagram further illustrating the integrated circuit (IC) package of FIG. 4, having the stacked die integrated with package voltage regulators, according to aspects of the present disclosure.

FIG. 5 is a cross-sectional diagram 500 further illustrating the integrated circuit (IC) package 420 of FIG. 4, having the stacked die integrated with package voltage regulators, according to aspects of the present disclosure. In this configuration, the IC package 420 includes the first package substrate 422 coupled to a backside surface of the first backside power delivery network 452 through first contact bumps 432 (e.g., first micro bumps). In addition, the second package substrate 424 is coupled to a backside surface of the second backside power delivery network 462 through second contact bumps 434 (e.g., second micro bumps) in the package core 430, which may be composed of a mold layer, mold underfill, or other like material. In addition a memory die 470 is coupled to the first package substrate 422 through first package bumps 404, and the second package substrate 424 is coupled to the printed circuit board 402 through second package bumps 406.

In this aspect of the present disclosure, the first package substrate 422 includes power lines 426 and signal lines 428. In this example, the signal lines 428 enable direct coupling between the memory die 470 and the first die 450 through the first package bumps 404 and the first contact bumps 432. Direct communication between the memory die 470 and the first die 450 through the signal lines 428 (without relying on package core interconnects) reduces latency as well as a footprint of the IC package 420. Furthermore, the power lines 426 provide power directly to the first die 450, without having to rely on conventional power lines feeding through the second die 460 (e.g., bottom die) to power the first die 450 (e.g., top die).

Figure 6B:
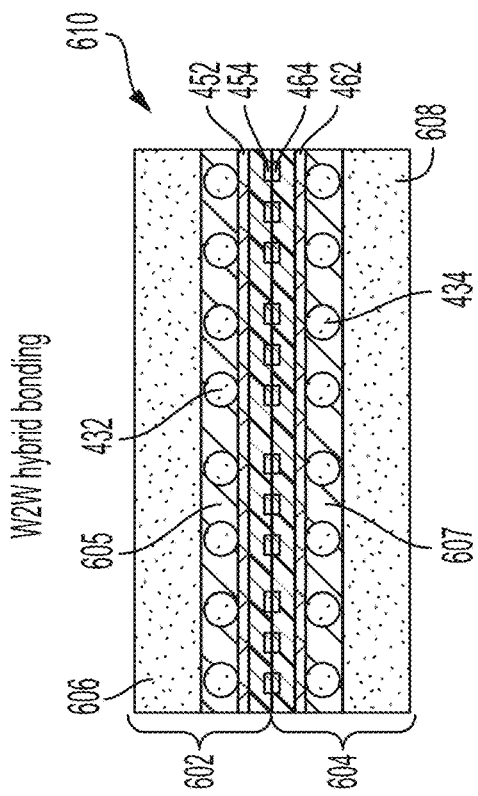
FIGS. 6A-6F are cross-sectional diagrams illustrating a process of fabricating the integrated circuit (IC) package of FIG. 5, having the stacked die integrated with package voltage regulators, according to aspects of the present disclosure.
Figure 6A:
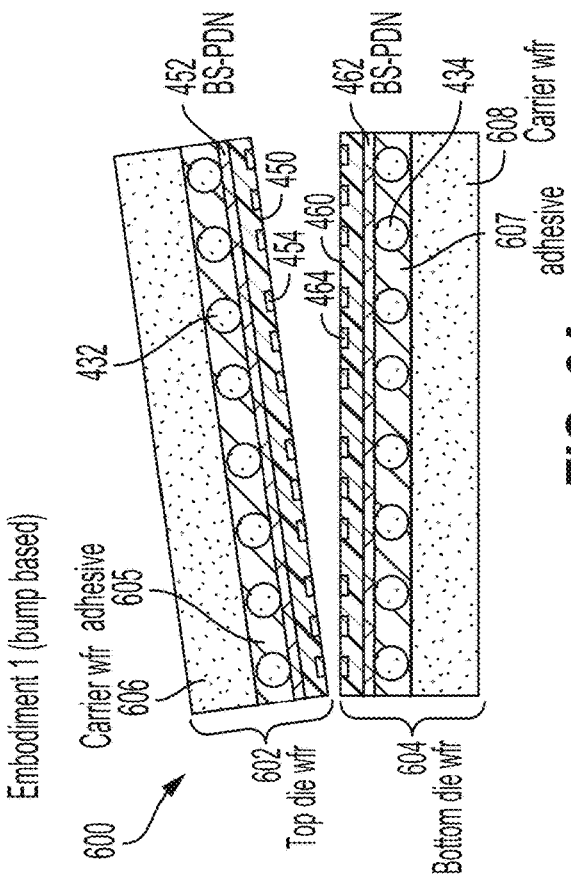

FIGS. 6A-6F are cross-sectional diagrams illustrating a process of fabricating the integrated circuit (IC) package 420 of FIG. 5, having the stacked die (450, 460) integrated with package voltage regulators 440 (440-1 . . . 440-N), according to aspects of the present disclosure. As shown in FIG. 6A, at step 600, a first die wafer 602 and a second die wafer 604 are separately formed, according to an aspect of the present disclosure. In this example, the first die wafer 602 includes the first die 450, having the first backside power delivery network 452 on a backside of the first die 450. In addition, the first contact bumps 432 are formed within a first adhesive layer 605 coupled to a first carrier wafer 606. Similarly, the second die wafer 604 includes the second die 460, having the second backside power delivery network 462 on a backside of the first die 450. In addition, the second contact bumps 434 are formed within a second adhesive layer 607 coupled to a second carrier wafer 608.

As shown in FIG. 6B, at step 610, a front-side of the first die wafer 602 is bonded to a front-side of the second die wafer 604 using hybrid wafer-to-wafer (W2W) bonding, according to aspects of the present disclosure. In one configuration, contact pads 454 of the first die wafer 602 align with contact pads 464 of the second die wafer 604.

Figure 6C:
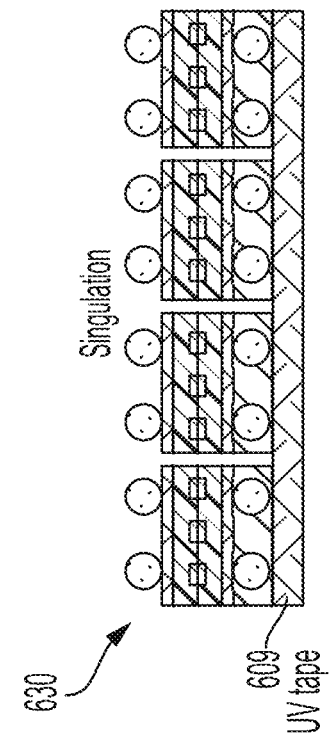

As shown in FIG. 6C, at step 620, the first carrier wafer 606 and the first adhesive layer 605 are removed to expose the first contact bumps 432 and the first backside power delivery network 452, according to aspects of the present disclosure. In addition, the second carrier wafer 608 is removed and an ultraviolet (UV) tape 609 is secured to the second adhesive layer 607.

Figure 6D:
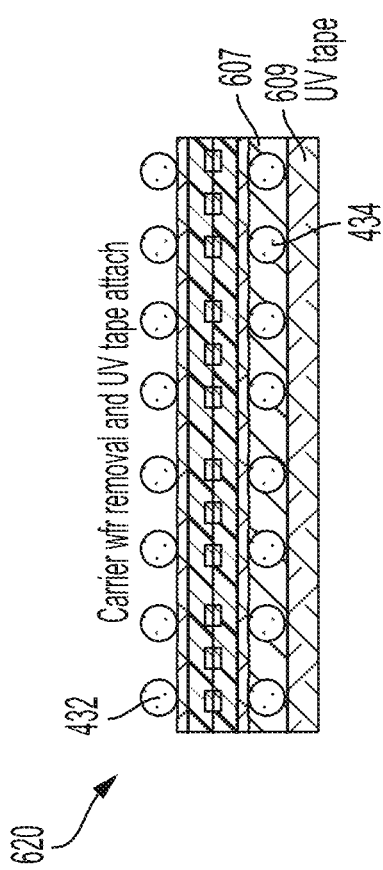
Figure 6E:
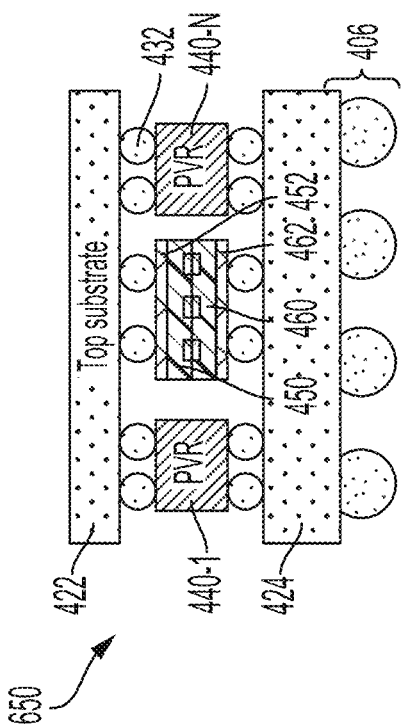
Figure 6F:
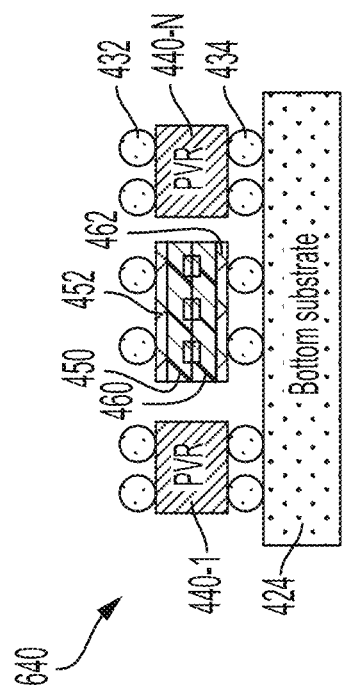

As shown in FIG. 6D, at step 630, a singulation process forms multiple stacked die having backside power delivery networks, according to aspects of the present disclosure. As shown in FIG. 6E, at step 640, a stacked die (e.g., the first die 450 and the second die 460), including first and second backside power delivery networks (e.g., 452 and 462), is placed on the second package substrate 424 between the package voltage regulators 440 (440-1 . . . 440-N), according to aspects of the present disclosure. As shown in FIG. 6F, at step 650, the first package substrate 422 attaches to the first contact bumps 432, and the second package bumps 406 are formed on the second package substrate 424, according to aspects of the present disclosure.

FIG. 7 is a cross-sectional diagram of the integrated circuit (IC) package 420 of FIG. 4, having a stacked die integrated with package voltage regulators 440 (440-1 . . . 440-N), according to another aspect of the present disclosure. The process of fabricating an integrated circuit (IC) package 700 of FIG. 7 includes previously described components, such as the stacked die (e.g., 450 and 460), including first and second backside power delivery networks (e.g., 452 and 462), the memory die 470, and first and second package bumps (e.g., 404 and 406), which are shown with similar reference numbers. Although shown as a memory die, it should be recognized that the memory die 470 may be another device, such as a lower performance die.

This aspect of the present disclosure replaces the first package substrate 422 and the second package substrate 424 with a first redistribution layer (RDL) substrate 490 and a second RDL substrate 492 to form the integrated circuit (IC) package 700. Beneficially, the first RDL substrate 490 and the second RDL substrate 492 replace the micro bumps (e.g., the first contact bumps 432 and the second contact bumps 434) within the package core 430 of the IC package 700. Replacing the micro bumps (e.g., the first contact bumps 432 and the second contact bumps 434) within the package core 430 of the IC package 700 may improve drop test performance of the IC package 700.

FIGS. 8A-8I are cross-sectional diagrams illustrating a process of fabricating the IC package 700 of FIG. 7, having the stacked die integrated with package voltage regulators, according to another aspect of the present disclosure. In this example, FIGS. 8A-8D, illustrating steps 800-830, are similar to FIGS. 6A-6D, illustrating steps 600-630 and, therefore, their descriptions are not repeated for sake of brevity. As shown in FIG. 8E, at step 840, a stacked die (e.g., the first die 450 and the second die 460), including first and second backside power delivery networks (e.g., 452 and 462), is placed on the second redistribution layer (RDL) substrate 492 between the package voltage regulators 440 (440-1 . . . 440-N), according to aspects of the present disclosure. As shown in FIG. 8F, at step 850, a mold grinding process is applied to the surface of the package core 430 to remove the second carrier wafer 608 to expose the stacked die and the package voltage regulators 440 (440-1 . . . 440-N). As shown in FIG. 8G, at step 860, the first RDL substrate 490 attaches to the exposed surface of the package core 430, according to aspects of the present disclosure.

As shown in FIG. 8H, at step 870, an ultraviolet (UV) tape 609 is secured to the second redistribution layer (RDL) substrate 492, and a singulation process forms multiple integrated circuit (IC) packages having stacked die (e.g., 450 and 460) integrated with package voltage regulators 440 (440-1 . . . 440-N), according to aspects of the present disclosure. As shown in FIG. 8I, at step 880, the ultraviolet (UV) tape 609 is removed, and the second package bumps 406 are formed on the second RDL substrate 492 to form the IC package 700, according to aspects of the present disclosure.

A benefit of the present disclosure is improved reliability, which is important in handheld devices specified to pass drop tests. In particular, cell phone makers continue to increase the specifications of these drop tests, and the ability to exceed drop tests (not just meet the standard) provides a competitive advantage. In addition, a significant performance increase, as well as an improved minimum target voltage (Vcc_min) at the die (e.g., the first die 450 and the second die 460), results from the combination of the external voltage regulator 410 and the package voltage regulators 440 (440-1 . . . 440-N), according to aspects of the present disclosure.

Figure 9:
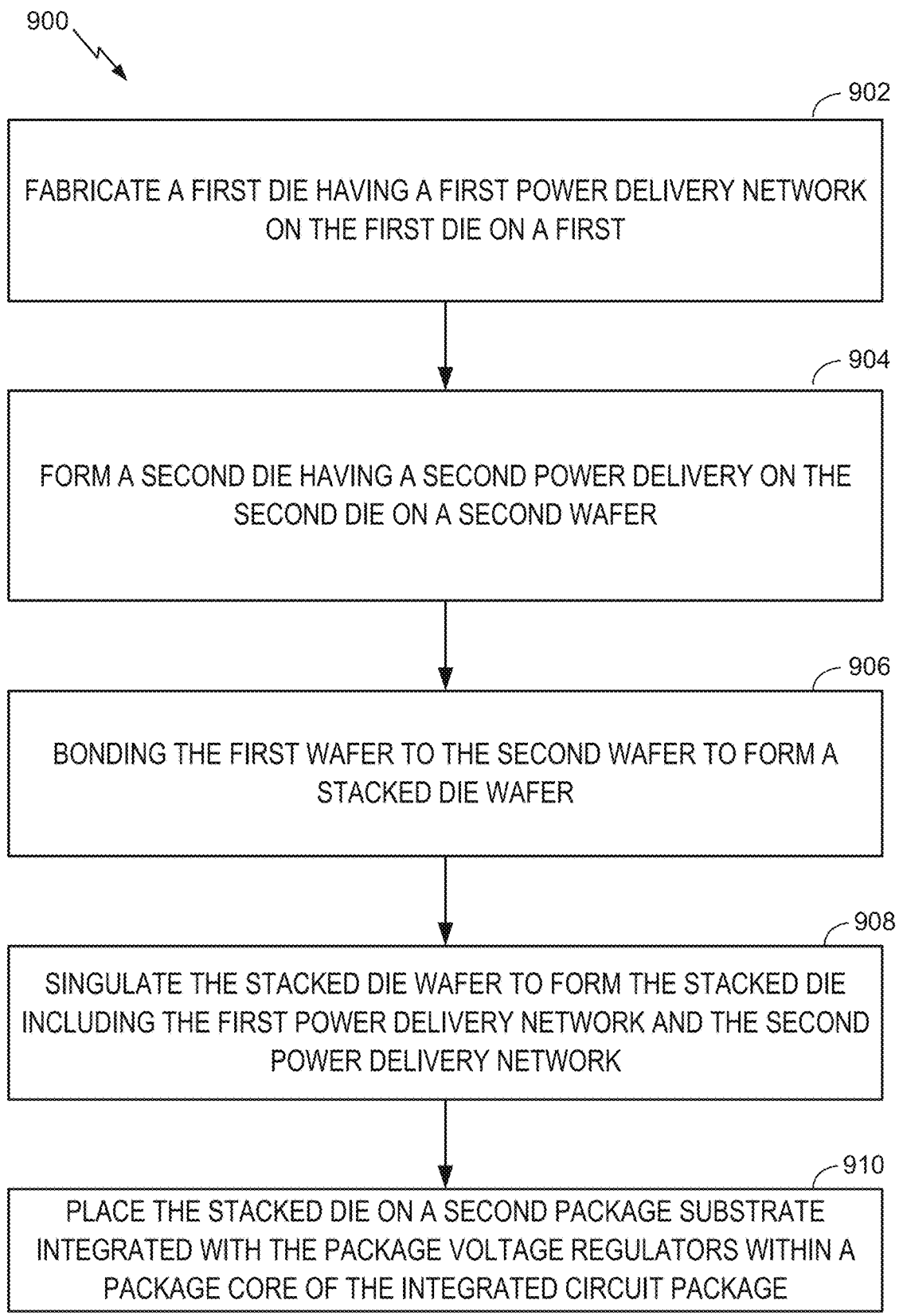
FIG. 9 is a process flow diagram illustrating a method for fabricating an integrated circuit (IC) package having a stacked die integrated with package voltage regulators, according to an aspect of the present disclosure.

FIG. 9 is a process flow diagram illustrating a method for fabricating an integrated circuit (IC) device package having a stacked die integrated with package voltage regulators, according to an aspect of the present disclosure. A method 900 begins in block 902, in which a first die having a first power delivery network on the first die is fabricated on a first wafer. At block 904, a second die is formed having a second power delivery network on the second die on a second wafer. For example, as shown in FIG. 6A, at step 600, the first die wafer 602 (e.g., first wafer) and the second die wafer 604 (e.g., second wafer) are separately formed. In this example, the first die wafer 602 (e.g., first wafer) includes the first die 450, having the first backside power delivery network 452 on a backside of the first die 450. Similarly, a second die wafer 604 (e.g., second wafer) includes the second die 460, having the second backside power delivery network 462 on a backside of the first die 450.

At block 906, the first wafer is bonded to the second wafer to form the stacked die wafer. For example, as shown in FIG. 6B, at step 610, a front-side of the first die wafer 602 (e.g., first wafer) is bonded to a front-side of the second die wafer 604 (e.g., second wafer) using a hybrid wafer-to-wafer (W2W) bonding. In one configuration, contact pads 454 of the first die wafer 602 align with contact pads 464 of the second die wafer 604. In an alternative configuration, the method 900 includes directly bonding a backside surface of the first die wafer to a back-side surface of the second die wafer.

At block 908, the stacked die wafer is singulated to form stacked die including the first power delivery network and the second power delivery network. For example, as shown in FIG. 6D, at step 630, a singulation process forms the stacked die having backside power delivery networks, according to aspects of the present disclosure. At block 910, the stacked die is placed on a second package substrate integrated with the package voltage regulators within a package core of the integrated circuit package. For example, as shown in FIG. 6E, at step 640, a stacked die (e.g., the first die 450 and the second die 460), including first and second backside power delivery networks (e.g., 452 and 462). In this configuration, the stacked die (e.g., the first die 450 and the second die 460) is placed on the second package substrate 424, between the package voltage regulators 440 (440-1 . . . 440-N), according to aspects of the present disclosure.

According to a further aspect of the present disclosure, an integrated circuit (IC) package includes a first die having a first power delivery network on the first die, and a second die having a second power delivery network on the second die. The first die is stacked on the second die. The IC package further includes means for regulating voltage integrated with and coupled to the first die and/or the second die within a package core of the integrated circuit package. In one configuration, the voltage regulation means may be the package voltage regulators 440, as shown in FIGS. 4, 5, and 7. In another aspect, the aforementioned means may be any structure or any material configured to perform the functions recited by the aforementioned means.

Figure 10:
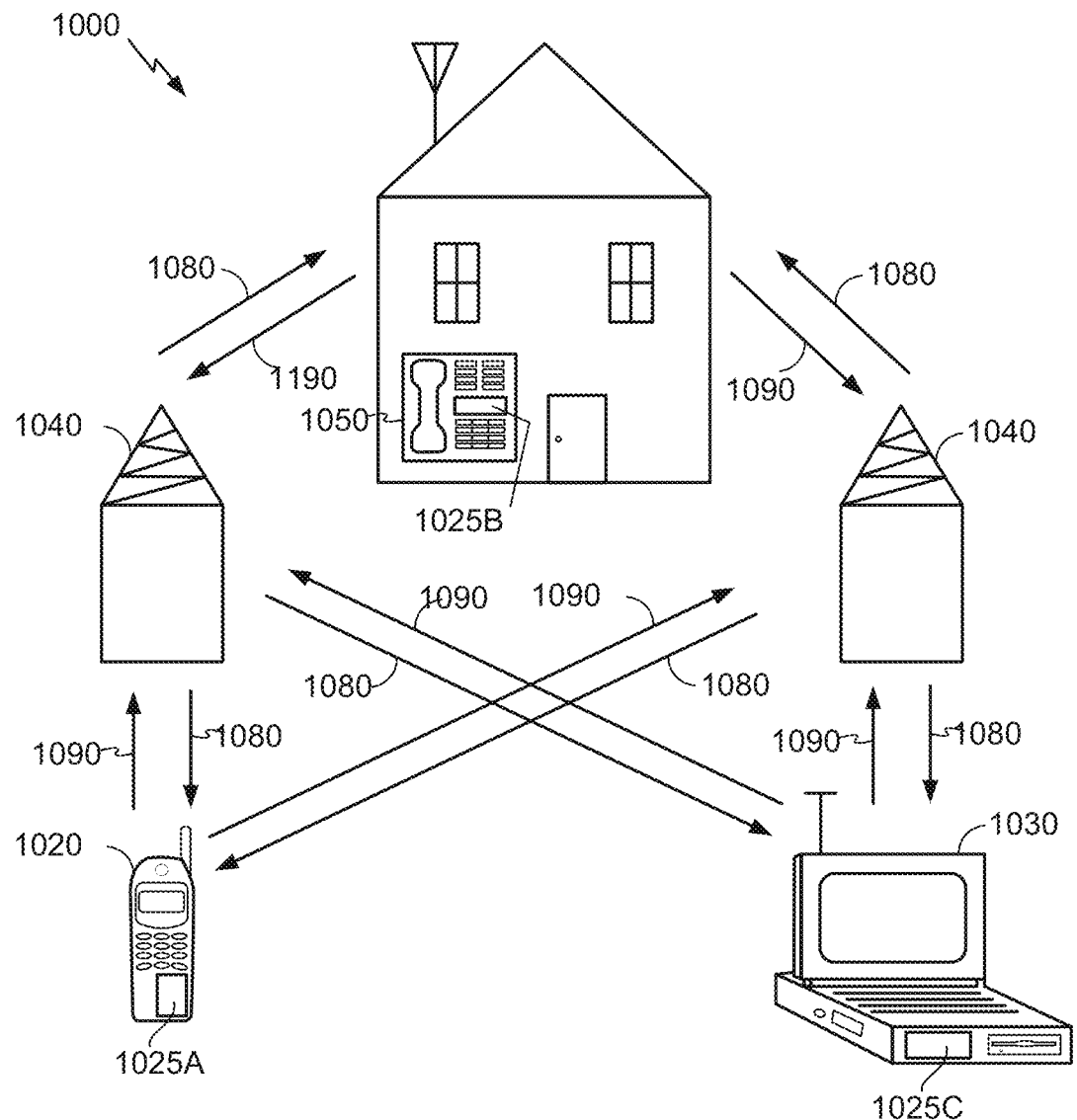
FIG. 10 is a block diagram showing an exemplary wireless communications system in which a configuration of the present disclosure may be advantageously employed.

FIG. 10 is a block diagram showing an exemplary wireless communications system 1000, in which an aspect of the present disclosure may be advantageously employed. For purposes of illustration, FIG. 10 shows three remote units 1020, 1030, and 1050, and two base stations 1040. It will be recognized that wireless communications systems may have many more remote units and base stations. Remote units 1020, 1030, and 1050 include integrated circuit (IC) devices 1025A, 1025B, and 1025C that include the disclosed stacked die integrated with package voltage regulators. It will be recognized that other devices may also include the disclosed stacked die integrated with package voltage regulators, such as the base stations, switching devices, and network equipment. FIG. 10 shows forward link signals 1080 from the base stations 1040 to the remote units 1020, 1030, and 1050, and reverse link signals 1090 from the remote units 1020, 1030, and 1050 to the base stations 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 10 illustrates remote units according to the aspects of the present disclosure, the disclosure is not limited to these exemplary illustrated units. Aspects of the present disclosure may be suitably employed in many devices, which include the disclosed stacked die integrated with package voltage regulators.

Figure 11:
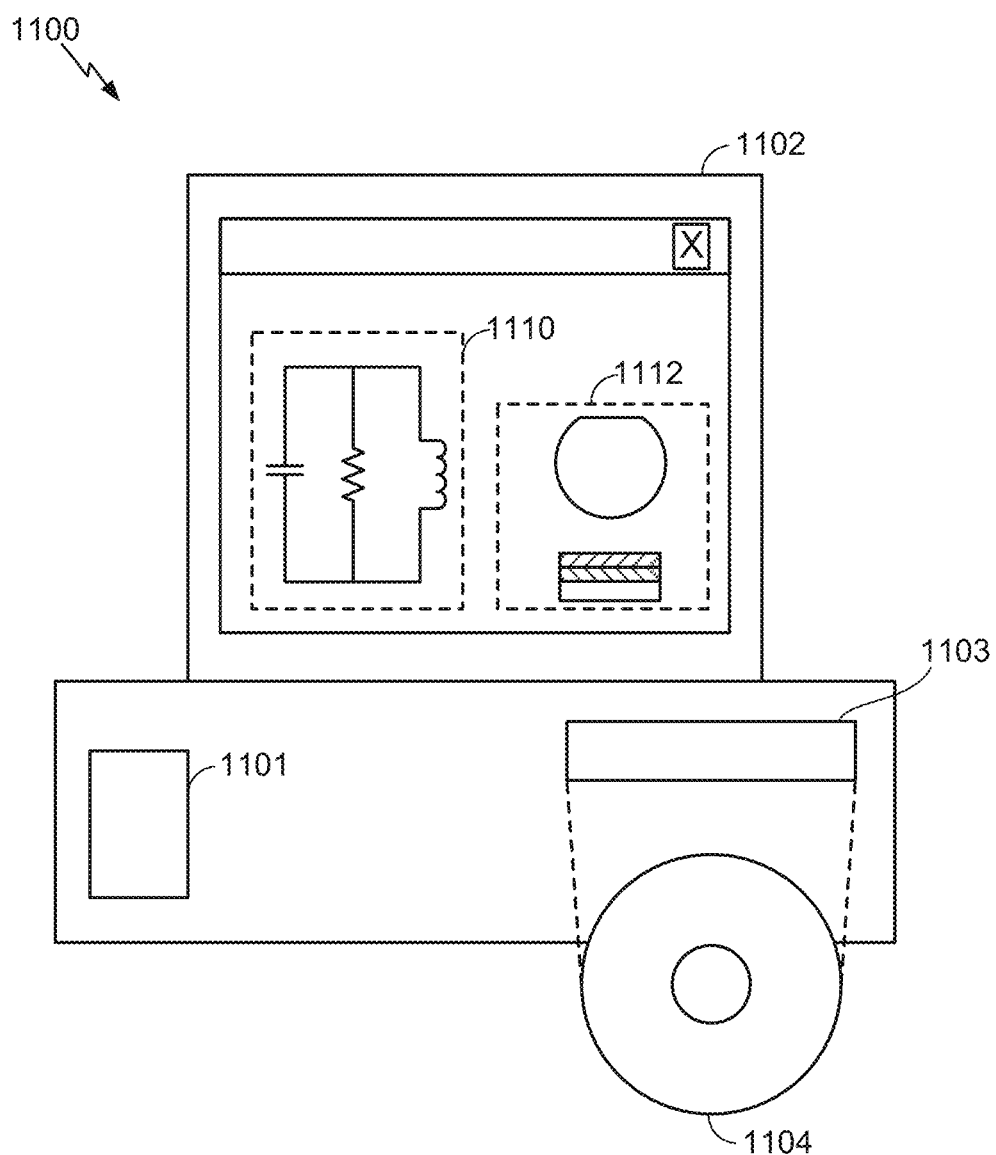
FIG. 11 is a block diagram illustrating a design workstation used for circuit, layout, and logic design of a semiconductor component according to one configuration.

FIG. 11 is a block diagram illustrating a design workstation 1100 used for circuit, layout, and logic design of a semiconductor component, such as the capacitors disclosed above. The design workstation 1100 includes a hard disk 1101 containing operating system software, support files, and design software such as Cadence or OrCAD. The design workstation 1100 also includes a display 1102 to facilitate design of a circuit 1110 or a semiconductor component 1112, such as stacked die integrated with package voltage regulators. A storage medium 1104 is provided for tangibly storing the design of the circuit 1110 or the semiconductor component 1112 (e.g., the stacked die integrated with package voltage regulators). The design of the circuit 1110 or the semiconductor component 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit 1110 or the semiconductor component 1112 by decreasing the number of processes for designing semiconductor wafers.

For a firmware and/or software implementation, the methodologies may be implemented with modules (e.g., procedures, functions, and so on) that perform the functions described. A machine-readable medium tangibly embodying instructions may be used in implementing the methodologies described. For example, software codes may be stored in a memory and executed by a processor unit. Memory may be implemented within the processor unit or external to the processor unit. As used, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include random access memory (RAM), read-only memory (ROM), electrically erasable read-only memory (EEPROM), compact disc read-only memory (CD-ROM) or other optical disk storage, magnetic disk storage or other magnetic storage devices, or other medium that can be used to store desired program code in the form of instructions or data structures and that can be accessed by a computer. Disk and disc, as used, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present disclosure is not intended to be limited to the particular configurations of the process, machine, manufacture, composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, erasable programmable read-only memory (EPROM), EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the present disclosure is provided to enable any person skilled in the art to make or use the present disclosure. Various modifications to the disclosure will be readily apparent to those skilled in the art, and the generic principles defined may be applied to other variations without departing from the spirit or scope of the disclosure. Thus, the present disclosure is not intended to be limited to the examples and designs described, but is to be accorded the widest scope consistent with the principles and novel features disclosed.

What is claimed is:

1. An integrated circuit (IC) package, comprising:
   a package core between two substrates;
   a first die having a first power delivery network on the first die, the first die located within the package core;
   a second die having a second power delivery network on the second die, in which the first die is stacked on the second die, the second die located within the package core; and a plurality of package voltage regulators integrated with and coupled to the first die and/or the second die within the package core of the integrated circuit package.

2. The IC package of claim 1, in which a front-side surface of the first die is directly bonded to a front-side surface of the second die.

3. The IC package of claim 1, in which a backside surface of the first die is directly bonded to a back-side surface of the second die.

4. The IC package of claim 1, further comprising a plurality of passive devices integrated with the plurality of package voltage regulators within the package core placed around a perimeter of the first die and the second die.

5. The IC package of claim 1,
in which the first die includes a front-side surface and a backside surface, opposite the front-side surface, the backside surface of the first die on a front-side surface of the first power delivery network; and
in which the second die includes a front-side surface on the front-side surface of the first die and a backside surface on a front-side surface of the second power delivery network, the second power delivery network being distal from the first power delivery network.

6. The IC package of claim 5, further comprising:
a first redistribution layer (RDL) substrate of the two substrates coupled to a backside surface of the first power delivery network; and
a second redistribution layer (RDL) substrate of the two substrates coupled to a backside surface of the second power delivery network, the second RDL substrate being distal from the first RDL substrate.

7. The IC package of claim 5, further comprising:
a first package substrate of the two substrates coupled to a backside surface of the first power delivery network through first contact bumps; and
a second package substrate of the two substrates coupled to a backside surface of the second power delivery network through second contact bumps, the second package substrate being distal from the first package substrate.

8. The IC package of claim 7, in which the plurality of package voltage regulators are coupled between the first package substrate and the second package substrate and coupled to the first die and/or the second die through the first contact bumps and/or the second contact bumps.

9. The IC package of claim 7, further comprising a memory die coupled to the first package substrate through first package bumps.

10. The IC package of claim 7, further comprising conductive core balls coupled between the first package substrate and the second package substrate.

11. The IC package of claim 1, further comprising:
a first redistribution layer (RDL) substrate of the two substrates coupled to a front-side surface of the first die; and
a second redistribution layer (RDL) substrate of the two substrates coupled to a front-side surface of the second die, the second RDL substrate being distal from the first RDL substrate.

12. The IC package of claim 1, further comprising:
a first package substrate of the two substrates coupled to a front-side surface of the first die through first contact bumps; and
a second package substrate of the two substrates coupled to a front-side surface of the second die through second contact bumps, the second package substrate being distal from the first package substrate.

13. A method for fabricating an integrated circuit package having a stacked die integrated with a plurality of package voltage regulators, comprising:
fabricating a first die having a first power delivery network on the first die on a first wafer;
fabricating a second die having a second power delivery network on the second die on a second wafer;
bonding the first wafer to the second wafer to form a stacked die wafer;
singulating the stacked die wafer to form the stacked die including the first power delivery network and the second power delivery network; and
placing the stacked die on a second package substrate integrated with the plurality of package voltage regulators within a package core of the integrated circuit package.

14. The method of claim 13, in which the bonding comprises directly bonding a front-side surface of the first die to a front-side surface of the second die.

15. The method of claim 13, in which the bonding comprises directly bonding a backside surface of the first die to a back-side surface of the second die.

16. The method of claim 13, further comprising placing a plurality of passive devices around a perimeter of the stacked die and integrated with the plurality of package voltage regulators within the package core of the integrated circuit package.

17. The method of claim 13, further comprising attaching a first package substrate to the stacked die and the plurality of package voltage regulators, in which the plurality of package voltage regulators and the stacked die are coupled between the first package substrate and the second package substrate.

18. An integrated circuit (IC) package, comprising:
a package core between two substrates;
a first die having a first power delivery network on the first die, the first die located within the package core;
a second die having a second power delivery network on the second die, in which the first die is stacked on the second die, the second die located within the package core; and
means for regulating voltage integrated with and coupled to the first die and/or the second die within the package core of the integrated circuit package.

19. The IC package of claim 18, in which a front-side surface of the first die is directly bonded to a front-side surface of the second die.

20. The IC package of claim 18, in which a backside surface of the first die is directly bonded to a back-side surface of the second die.

* * * * *